US010243550B2

United States Patent
Nallamothu (10) Patent No.: US 10,243,550 B2
(45) Date of Patent: Mar. 26, 2019

(54) HIGH VOLTAGE COMPARATOR (71) Applicant: STMicroelectronics, Inc., Coppell, TX (US)

(72) Inventor: Pavan Nallamothu, Little Elm, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 15/625,261

(22) Filed: Jun. 16, 2017

(65) Prior Publication Data
US 2018/0367131 A1 Dec. 20, 2018

(51) Int. Cl.
*H03K 5/153* (2006.01)
*H03K 17/082* (2006.01)
*H03K 5/24* (2006.01)
*G05F 1/56* (2006.01)

(52) U.S. Cl.
CPC ........ *H03K 17/0822* (2013.01); *G05F 1/561* (2013.01); *H03K 5/24* (2013.01)

(58) Field of Classification Search
None
See application file for complete search history.

(56) References Cited

U.S. PATENT DOCUMENTS

2004/0251941 A1* 12/2004 Shi .................. H03K 5/023
327/172
2010/0079127 A1 4/2010 Grant
2017/0141562 A1 5/2017 Looby et al.

FOREIGN PATENT DOCUMENTS

DE 10209677 C1 7/2003
GB 2451467 A 2/2009

OTHER PUBLICATIONS

EPO Search Report and Written Opinion for co-pending EP Appl. No. 18175496.1 dated Oct. 9, 2018 (12 pages).

* cited by examiner

*Primary Examiner* — Long Nguyen
(74) *Attorney, Agent, or Firm* — Crowe & Dunlevy (57) ABSTRACT

An electronic device includes a power switch having a control terminal coupled to a first node, a first conduction terminal coupled to a second node, and a second conduction terminal coupled to a third node. A monitoring circuit has a first input coupled to the first node and a second input coupled to the second node, the monitoring circuit to generate a monitor signal indicating gate oxide stress on the power switch as a function of first and second voltages received at the first and second inputs thereof. A protection circuit actuates to protect the power switch from the gate oxide stress when the monitor signal indicates the gate oxide stress on the power switch. The monitoring signal is generated based upon a comparison of currents generated based upon the voltages at the first and second node, as well as a current generated based upon a programmable reference voltage.

23 Claims, 7 Drawing Sheets

HIGH VOLTAGE COMPARATOR

TECHNICAL FIELD

This disclosure relates to a gate monitoring circuit for a power switch in a high voltage environment, where the gate monitoring circuit is capable of detecting stresses on the gate oxide of the power switch.

BACKGROUND

In high voltage power MOS transistors, or in scaled down MOS transistors, breakdown of the gate oxide and gate oxide reliability becomes a concern. Higher electric fields in the oxide increase the incidence of tunneling of carriers from the channel into the gate oxide. These carriers slowly degrade the quality of the gate oxide, over time leading failure of the gate oxide. This effect is referred to as time dependent destructive breakdown.

Development in the area of protection circuits for the gate oxide of transistors in some environments have been developed. However, the development of protection circuits for the gate oxides of power MOS transistors in high voltage applications is still needed.

SUMMARY

Disclosed herein is an electronic device including a power switch having a control terminal coupled to a first node, a first conduction terminal coupled to a second node, and a second conduction terminal coupled to a third node. The electronic device includes a monitoring circuit with a first input coupled to the first node and a second input coupled to the second node, the monitoring circuit being configured to generate a monitor signal indicating gate oxide stress on the power switch as a function of first and second voltages respectively received at the first and second inputs thereof.

The monitoring circuit includes a first voltage to current converter generating a first current as a function of a first input voltage, a second voltage to current converter generating a second current as a function of a second input voltage, a third voltage to current converter generating a reference current as a function of a reference voltage, and a current summing node. The current summing node is coupled to receive the first current, second current, and reference current such that the first current is sourced to the current summing node, the second current is sunk from the current summing node, and the reference current is sunk from the current summing node. A buffer has an input coupled to the current summing node. A protection circuit is configured to actuate to protect the power switch from the gate oxide stress when the monitor signal indicates the gate oxide stress on the power switch. The reference voltage is programmable.

The first voltage to current converter includes a first amplifier having a non-inverting terminal coupled to a first voltage, an inverting terminal coupled to a first feedback node, and an output. The first voltage to current converter also includes a first transistor having a first conduction terminal coupled to a current mirror input, a second conduction terminal coupled the first feedback node, and a control terminal coupled to the output of the first amplifier. The first current is drawn from the current mirror input. A first resistive divider is coupled between the first input voltage and ground and producing the first voltage at a center tap thereof. A first resistor is coupled between the second conduction terminal of the first transistor and ground.

A current mirror has the current mirror input, a current mirror output coupled to the current summing node, and is configured to mirror the first current to the current summing node.

The second voltage to current converter includes a second amplifier having a non-inverting terminal coupled to a second voltage, an inverting terminal coupled to a second feedback node, and an output. The second voltage to current converter also includes a second transistor having a first conduction terminal coupled to the current summing node, a second conduction terminal coupled the second feedback node, and a control terminal coupled to the output of the second amplifier. The second current is drawn from the current summing node. A second resistive divider is coupled between the second input voltage and ground and producing the second voltage at a center tap thereof. A second resistor is coupled between the second conduction terminal of the second transistor and ground.

The third voltage to current converter includes a third amplifier having a non-inverting terminal coupled to a third voltage, an inverting terminal coupled to a third feedback node, and an output. A third transistor has a first conduction terminal coupled to the current summing node, a second conduction terminal coupled the third feedback node, and a control terminal coupled to the output of the third amplifier. The third current is drawn from the current summing node. A third resistive divider is coupled between the third voltage and ground and producing the third voltage at a center tap thereof. A third resistor is coupled between the second conduction terminal of the third transistor and ground.

In some embodiments, the device includes a second current summing node, with a first current mirror configured to mirror the first current to the second current summing node, a second current mirror configured to mirror the second current to the second current summing node, and a third current mirror configured to mirror the reference current to the second current summing node. The second current summing node receives the first current, second current, and reference current such that the second current is sourced to the second current summing node, the first current is sunk from the second current summing node, and the reference current is sunk from the second current summing node. A second buffer has an input coupled to the second current summing node. An OR gate is coupled to receive as input outputs from the first and second buffers.

The buffer is configured to output the reference voltage (which may be a supply voltage Vdd) where the first current is greater than a sum of the second current and the reference current. The buffer is configured to output a ground voltage where the first current is less than the sum of the second current and the reference current. The second buffer is configured to output the reference voltage where the second current is greater than a sum of the first current and the reference current. The second buffer is configured to output a ground voltage where the second current is less than the sum of the first current and the reference current.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout.

Figure 1:
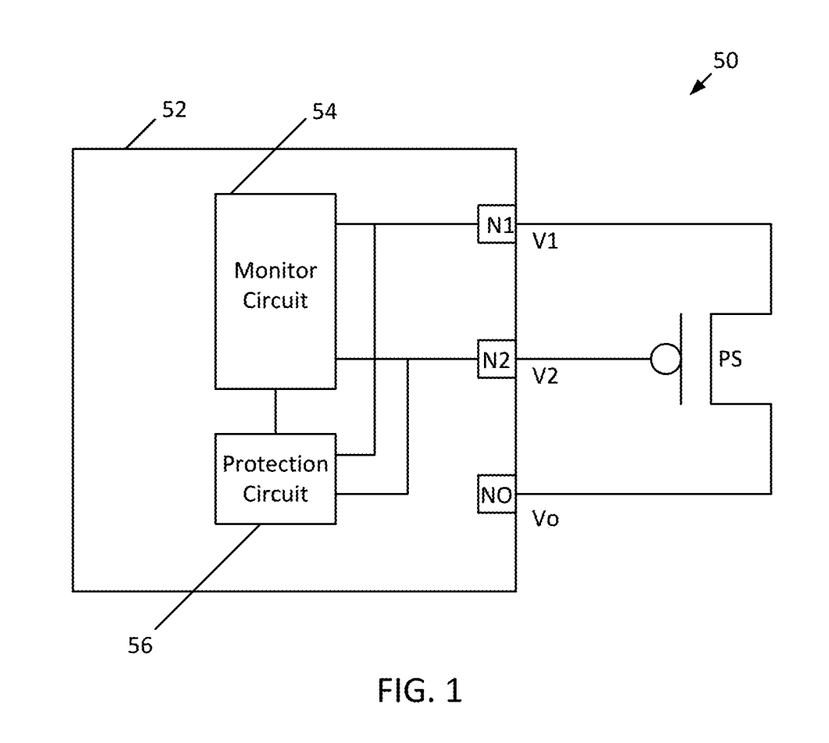
FIG. 1 is a block diagram of an electronic device including a monitoring circuit in accordance with this disclosure.

With initial reference to FIG. 1, an electronic device 50 is now described. The electronic device 50 includes an integrated circuit 52, such as an application specific integrated circuit (ASIC). A power switch p-channel transistor PS has a source coupled to a first node or pad N1 of the ASIC 52, a gate coupled to a second node or pad N2 of the ASIC 52, and a drain coupled to an output node NO of the ASIC 52. A first voltage V1 is at node N1, a second voltage V2 is at node N2, and an output voltage Vo is at node NO. The ASIC 52 includes a monitoring circuit 54 that receives the voltages V1 and V2 as input, and determines whether the gate to source voltage across the power switch p-channel transistor PS is such that the gate oxide may become damaged. Based upon such a determination, protection circuitry 56 within the ASIC 52 then acts to alter the gate to source voltage across the power switch p-channel transistor PS so as to prevent damage to the gate oxide.

Figure 2:
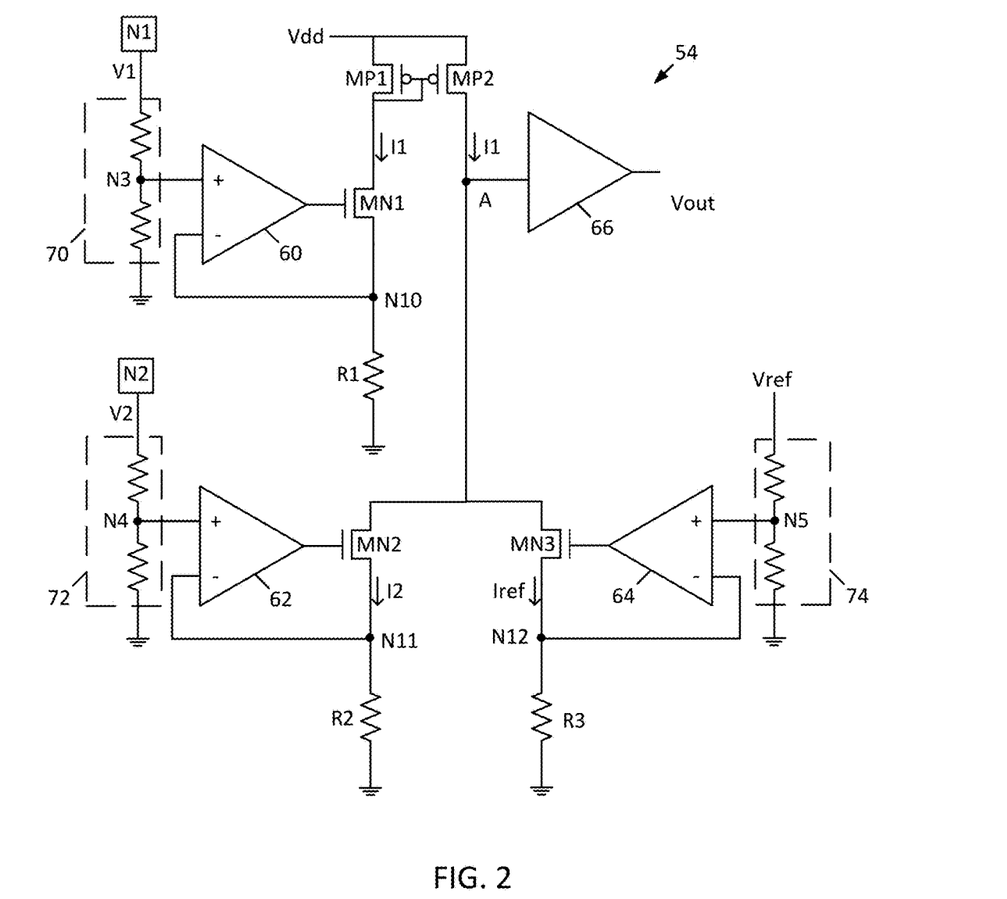
FIG. 2 is a schematic block diagram of a first embodiment of the monitoring circuit of FIG. 1.

With additional reference to FIG. 2, details of a first embodiment of a monitoring circuit 54 are now given. The monitoring circuit 54 receives voltage V1 as a first input voltage at node N1. A voltage divider 70 is coupled between node N1 and ground. A first amplifier 60 has a non-inverting terminal coupled to the voltage divider 70 at center tap N3, and an inverting terminal coupled to node N10. A resistor R1 is coupled between node N10 and ground. An n-channel transistor MN1 has its gate coupled to be biased by the output of amplifier 60, its source coupled to node N10, and its drain coupled to a current mirror formed by p-channel transistors MP1-MP2. This arrangement forms a current to voltage converter, generating current I1 as having a magnitude that is proportional to the voltage at node N3 (and thus proportional to voltage V1).

The monitoring circuit 54 receives voltage V2 as a second input voltage at node N2. A voltage divider 72 is coupled between node N2 and ground. A second amplifier 62 has a non-inverting terminal coupled to the voltage divider 72 at center tap N4, and an inverting terminal coupled to node N11. A resistor R2 is coupled between node N11 and ground. An n-channel transistor MN2 has its gate coupled to be biased by the output of amplifier 62, its source coupled to node N11, and its drain coupled to node A. This arrangement forms a current to voltage converter, generating current I2 as having a magnitude that is proportional to the voltage at node N4 (and thus proportional to voltage V2).

The monitoring circuit 54 receives a reference voltage Vref (which may be a supply voltage Vdd), and a voltage divider 74 is coupled between the reference voltage Vref and ground. A third amplifier 64 has a non-inverting terminal coupled to the voltage divider 74 at center tap N5, and an inverting terminal coupled to node N12. A resistor R3 is coupled between node N12 and ground. An n-channel transistor MN3 has its gate coupled to be biased by the output of amplifier 64, its source coupled to node N12, and its drain coupled to node A. This arrangement forms a current to voltage converter, generating current Iref as having a magnitude that is proportional to the voltage at node N5 (and thus proportional to voltage Vref). As will be explained below, voltage Vref is programmable or settable, resulting in the magnitude of the current Iref being programmable or settable.

Buffer 66 has its input coupled to node A and provides an output signal Vout.

Operation of the monitoring circuit 54 is now described. Amplifier 60 acts as a voltage to current converter and controls transistor MN1 to draw current I1, and current I1, is based on voltage V1. The current mirror formed from transistors MP1-MP2 mirrors current I1, to be sourced into node A. Amplifier 62 acts as a voltage to current converter and controls transistor MN2 to draw current I2, and current I2 is based on voltage V2. Current I2 is sunk from node A. Amplifier 64 acts as a voltage to current converter and controls transistor MN3 to draw reference current Iref, and reference current Iref is based on reference voltage Vref. Reference current Iref is sunk from node A.

Node A acts as a current summing junction. Since current I1, is sourced to node A, while currents I2 and Iref are sunk from node A, node A acts to subtract currents I2 and Iref from node A. Therefore, if I1≥I2+Iref, the current flow into the input of buffer 66 will be positive and the voltage at node A will increase, resulting in the output Vout of buffer 66 going to Vref (which may be Vdd). If I1<I2+Iref, current will be drawn from, or not flow into, the input of buffer 66, resulting in the output Vout of buffer 66 falling to ground.

Figure 6:
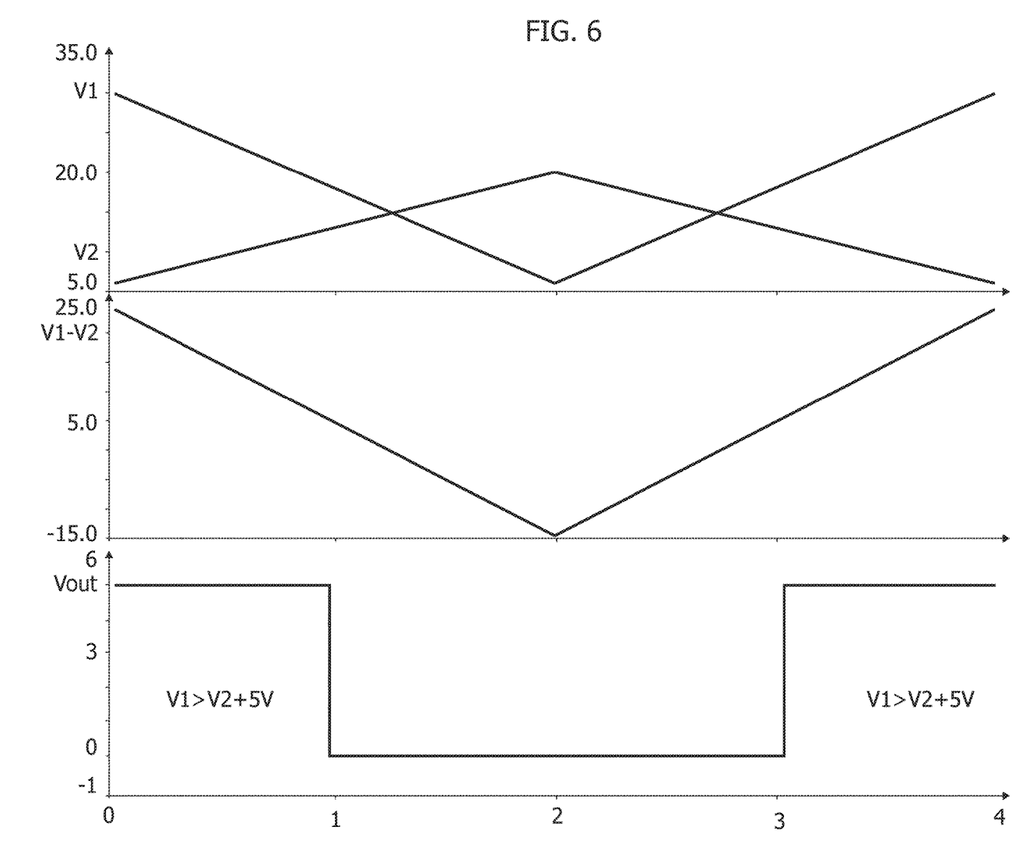
FIG. 6 is a graph showing input and output voltages of the first embodiment.

This operation can be clearly seen in FIG. 6. At time t=0, voltage V1 is 30V, voltage V2 is 6V, and V1-V2 is 24V. Vref is at Vdd, which is 5V. Since 30>6+5, Vout transitions to Vdd (i.e. 5V). Thus, if I1>I2+Iref, Vout will equal Vref (which may be Vdd). At time t=1, voltage V1 is 17.5V, voltage V2 is 12.5V, and V1-V2 is 5V. Vref is 5V. Since 17.5V=12.5V+5V, Vout will equal Vref (which may be Vdd). At time t=2, voltage V1 is 6V, voltage V2 is 20V, and V1-V2 is −14V. Since 6<20+5, Vout is at 0V. Therefore, if I1<I2+Iref, Vout will be at ground.

Figure 3:
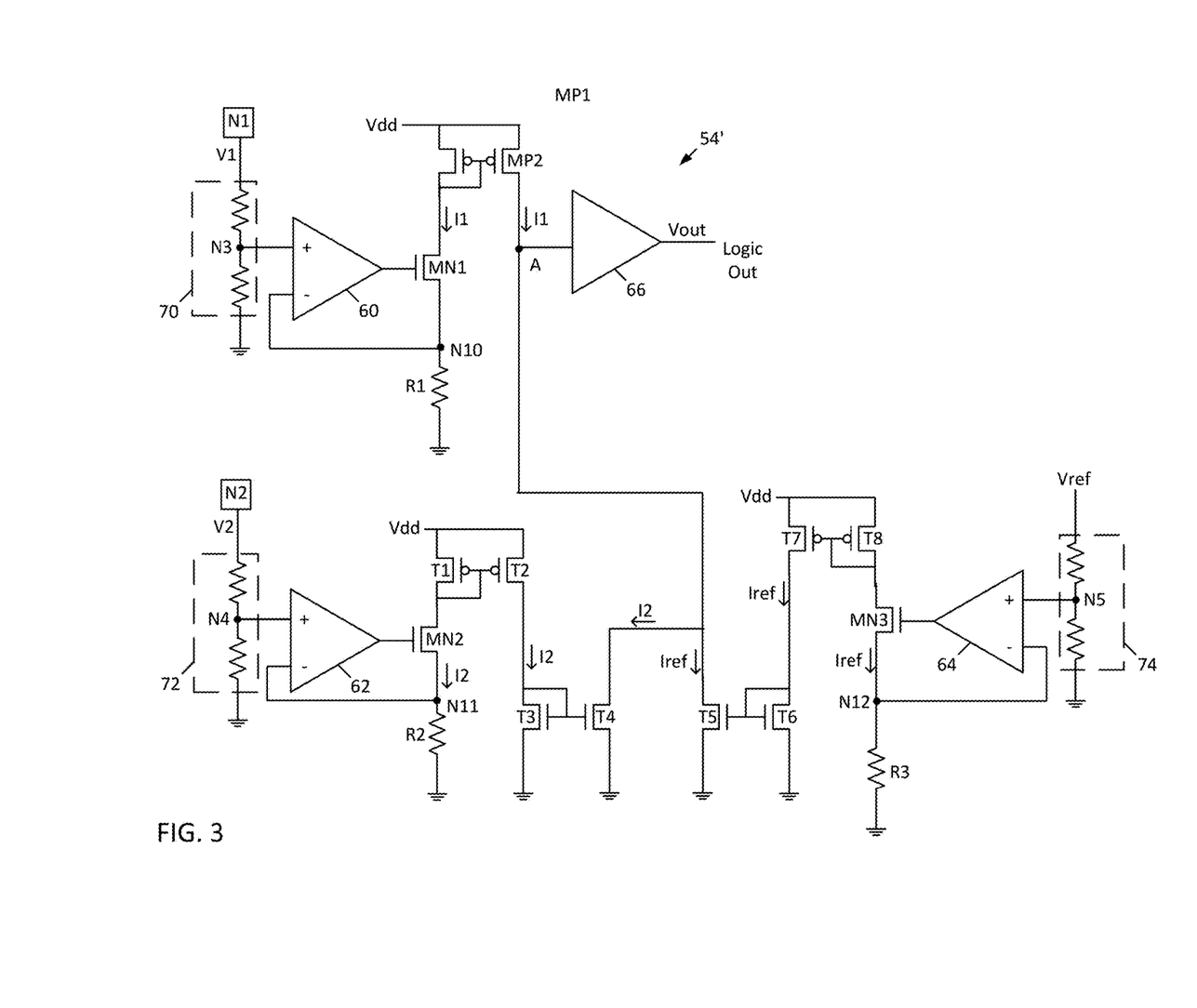
FIG. 3 is a schematic block diagram of a more detailed version of the first embodiment of the monitoring circuit of FIG. 1.

A more detailed version of the monitoring circuit 54' is now described with additional reference to FIG. 3. The monitoring circuit 54' receives voltage V1 as a first input voltage at node N1. A voltage divider 70 is coupled between node N1 and ground. A first amplifier 60 has a non-inverting terminal coupled to the voltage divider 70 at center tap N3, and an inverting terminal coupled to node N10. A resistor R1 is coupled between node N10 and ground. An n-channel transistor MN1 has its gate coupled to be biased by the output of amplifier 60, it source coupled to node N10, and its drain coupled to a current mirror formed by p-channel transistors MP1-MP2.

The monitoring circuit 54' receives voltage V2 as a second input voltage at node N2. A voltage divider 72 is coupled between node N2 and ground. A second amplifier 62 has a non-inverting terminal coupled to the voltage divider 72 at center tap N4, and an inverting terminal coupled to node N11. A resistor R2 is coupled between node N11 and ground. An n-channel transistor MN2 has its gate coupled to be biased by the output of amplifier 62, it source coupled to node N11, and its drain coupled to a current mirror formed by p-channel transistors T1-T2. A current mirror formed by n-channel transistors T3-T4 is coupled between the output of the current mirror formed by p-channel transistors T1-T2 and node A.

The monitoring circuit 54' receives a reference voltage Vref (which may be Vdd), and a voltage divider 74 is coupled between the reference voltage Vref (which may be Vdd) and ground. A third amplifier 64 has a non-inverting terminal coupled to the voltage divider 74 at center tap N5, and an inverting terminal coupled to node N12. A resistor R3 is coupled between node N12 and ground. An n-channel transistor MN3 has its gate coupled to be biased by the output of amplifier 64, it source coupled to node N12, and its drain coupled to the current mirror formed by p-channel transistors T7-T8. A current mirror formed by n-channel transistors T5-T6 is coupled between the output of the current mirror formed by p-channel transistors T7-T8 and node A.

Buffer 66 has its input coupled to node A and provides the output signal Vout.

Operation of the monitoring circuit 54' is now described. Amplifier 60 acts as a voltage to current converter and controls transistor MN1 to draw current I1, and current I1, is based on voltage V1. The current mirror formed from transistors MP1-MP2 mirrors current I1, to be sourced into node A.

Amplifier 62 acts as a voltage to current converter and controls transistor MN2 to draw current I2, and current I2 is based on voltage V2. Current I2 is mirrored through the current mirror formed by p-channel transistors T1-T2, through the current mirror formed by n-channel transistors T3-T4, and sunk from node A.

Amplifier 64 acts as a voltage to current converter and controls transistor MN3 to draw reference current Iref, and reference current Iref is based on reference voltage Vref. Reference current Iref is mirrored through the current mirror formed by p-channel transistors T7-T8, through the current mirror formed by n-channel transistors T5-T6, and sunk from node A.

As explained above, node A acts as a current summing junction. Therefore, if I1≥I2+Iref, the current flow into the input of buffer 66 will be positive, increasing the voltage of node A, resulting in the output Vout of buffer 66 going to Vref (which may be supply Vdd). If I1<I2+Iref, current will be drawn from, or not flow into, the input of buffer 66, resulting in the output Vout of buffer 66 falling to ground.

Figure 4:
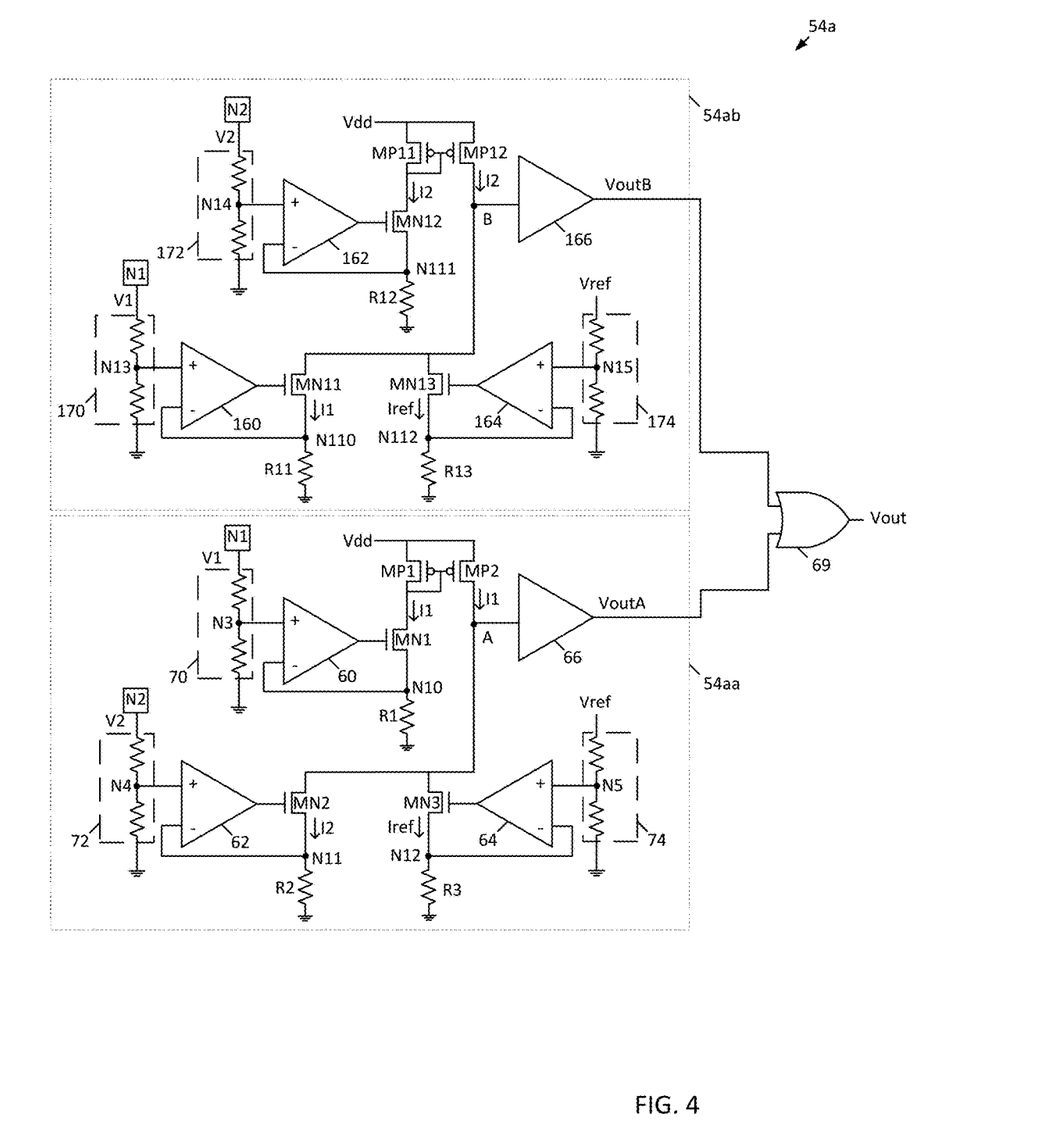
FIG. 4 is a schematic block diagram of a second embodiment of the monitoring circuit of FIG. 1.

With additional reference to FIG. 4, details of another embodiment of a monitoring circuit 54a are now given. The monitoring circuit 54a includes first and second sub-monitoring circuits 54aa and 54ab, the outputs of which are logically OR'd together by OR gate 69.

The sub-monitoring circuit 54aa receives voltage V1 as a first input voltage at node N1. A voltage divider 70 is coupled between node N1 and ground. A first amplifier 60 has a non-inverting terminal coupled to the voltage divider 70 at center tap N3, and an inverting terminal coupled to node N10. A resistor R1 is coupled between node N10 and ground. An n-channel transistor MN1 has its gate coupled to be biased by the output of amplifier 60, its source coupled to node N10, and its drain coupled to a current mirror formed by p-channel transistors MP1-MP2. This arrangement forms a current to voltage converter, generating current I1, as having a magnitude that is proportional to the voltage at node N3 (and thus proportional to voltage V1).

The monitoring circuit 54aa receives voltage V2 as a second input voltage at node N2. A voltage divider 72 is coupled between node N2 and ground. A second amplifier 62 has a non-inverting terminal coupled to the voltage divider 72 at center tap N4, and an inverting terminal coupled to node N11. A resistor R2 is coupled between node N11 and ground. An n-channel transistor MN2 has its gate coupled to be biased by the output of amplifier 62, its source coupled to node N11, and its drain coupled to node A. This arrangement forms a current to voltage converter, generating current I2 as having a magnitude that is proportional to the voltage at node N4 (and thus proportional to voltage V2).

The monitoring circuit 54aa receives a reference voltage Vref, and a voltage divider 74 is coupled between the reference voltage Vref and ground. A third amplifier 64 has a non-inverting terminal coupled to the voltage divider 74 at center tap N5, and an inverting terminal coupled to node N12. A resistor R3 is coupled between node N12 and ground. An n-channel transistor MN3 has its gate coupled to be biased by the output of amplifier 64, its source coupled to node N12, and its drain coupled to node A. This arrangement forms a current to voltage converter, generating current Iref as having a magnitude that is proportional to the voltage at node N5 (and thus proportional to voltage Vref). As will be explained below, voltage Vref is programmable or settable, resulting in the magnitude of the current Iref being programmable or settable.

Buffer 66 has its input coupled to node A and provides an output signal VoutA.

The sub-monitoring circuit 54ab receives voltage V2 as a first input voltage at node N2. A voltage divider 172 is coupled between node N14 and ground. An amplifier 162 has a non-inverting terminal coupled to the voltage divider 172 at center tap N14, and an inverting terminal coupled to node N111. A resistor R12 is coupled between node N111 and ground. An n-channel transistor MN12 has its gate coupled to be biased by the output of amplifier 162, its source coupled to node N111, and its drain coupled to a current mirror formed by p-channel transistors MP1-MP2. This arrangement forms a current to voltage converter, generating current I2 as having a magnitude that is proportional to the voltage at node N14 (and thus proportional to voltage V2).

The monitoring circuit 54aa receives voltage V1 as a second input voltage at node N1. A voltage divider 170 is coupled between node N2 and ground. A second amplifier 160 has a non-inverting terminal coupled to the voltage divider 170 at center tap N13, and an inverting terminal coupled to node N110. A resistor R11 is coupled between node N110 and ground. An n-channel transistor MN11 has its gate coupled to be biased by the output of amplifier 160, its source coupled to node N110, and its drain coupled to node B. This arrangement forms a current to voltage converter, generating current I1, as having a magnitude that is proportional to the voltage at node N13 (and thus proportional to voltage V1).

The monitoring circuit 54aa receives a reference voltage Vref, and a voltage divider 174 is coupled between the reference voltage Vref and ground. A third amplifier 164 has a non-inverting terminal coupled to the voltage divider 174 at center tap N15, and an inverting terminal coupled to node N112. A resistor R13 is coupled between node N112 and ground. An n-channel transistor MN13 has its gate coupled to be biased by the output of amplifier 164, its source coupled to node N112, and its drain coupled to node B. This arrangement forms a current to voltage converter, generating current Iref as having a magnitude that is proportional to the voltage at node N15 (and thus proportional to voltage Vref).

Buffer 166 has its input coupled to node B and provides an output signal VoutB.

Operation of the monitoring circuit 54a is now described. Amplifier 60 acts as a voltage to current converter and controls transistor MN1 to draw current I1, and current I1, is based on voltage V1. The current mirror formed from transistors MP1-MP2 mirrors current I1, to be sourced into node A. Amplifier 62 acts as a voltage to current converter and controls transistor MN2 to draw current I2, and current I2 is based on voltage V2. Current I2 is sunk from node A. Amplifier 64 acts as a voltage to current converter and controls transistor MN3 to draw reference current Iref, and reference current Iref is based on reference voltage Vref. Reference current Iref is sunk from node A.

Amplifier 162 acts as a voltage to current converter and controls transistor MN12 to draw current I2, and current I2 is based on voltage V2. The current mirror formed from transistors MP11-MP12 mirrors current I2 to be sourced into node B. Amplifier 160 acts as a voltage to current converter and controls transistor MN11 to draw current I1, and current I1, is based on voltage V1. Current I1, is sunk from node B. Amplifier 164 acts as a voltage to current converter and controls transistor MN13 to draw reference current Iref, and reference current Iref is based on reference voltage Vref. Reference current Iref is sunk from node B.

Node A acts as a current summing junction. Therefore, if I1≥I2+Iref, the current flow into the input of buffer 66 will be positive, resulting in the output VoutA of buffer 66 going to Vref (which may be Vdd). If I1<I2+Iref, current will be drawn from, or not flow into, the input of buffer 66, resulting in the output VoutA of buffer 66 falling to ground.

Node B also acts as a current summing junction. Since current I2 is sourced to node B while currents I1, and Iref are sunk from node B, if I2≥I1+Iref, the current flow into the input of buffer 166 will be positive resulting in the output VoutB of buffer 166 going to Vref (which may be Vdd). If I2<I1+Iref, current will be drawn from, or not flow into, the input of buffer 68, resulting in the output VoutB of buffer 68 falling to ground. Outputs VoutA and VoutB are logically OR'd together by OR gate 69 to provide output signal Vout. Thus, Vout will be at Vref (which may be Vdd) if I1≥I2+Iref or if I2≥I1+Iref, and will be at ground if I1<I2+Iref or if I2<I1+Iref.

Figure 7:
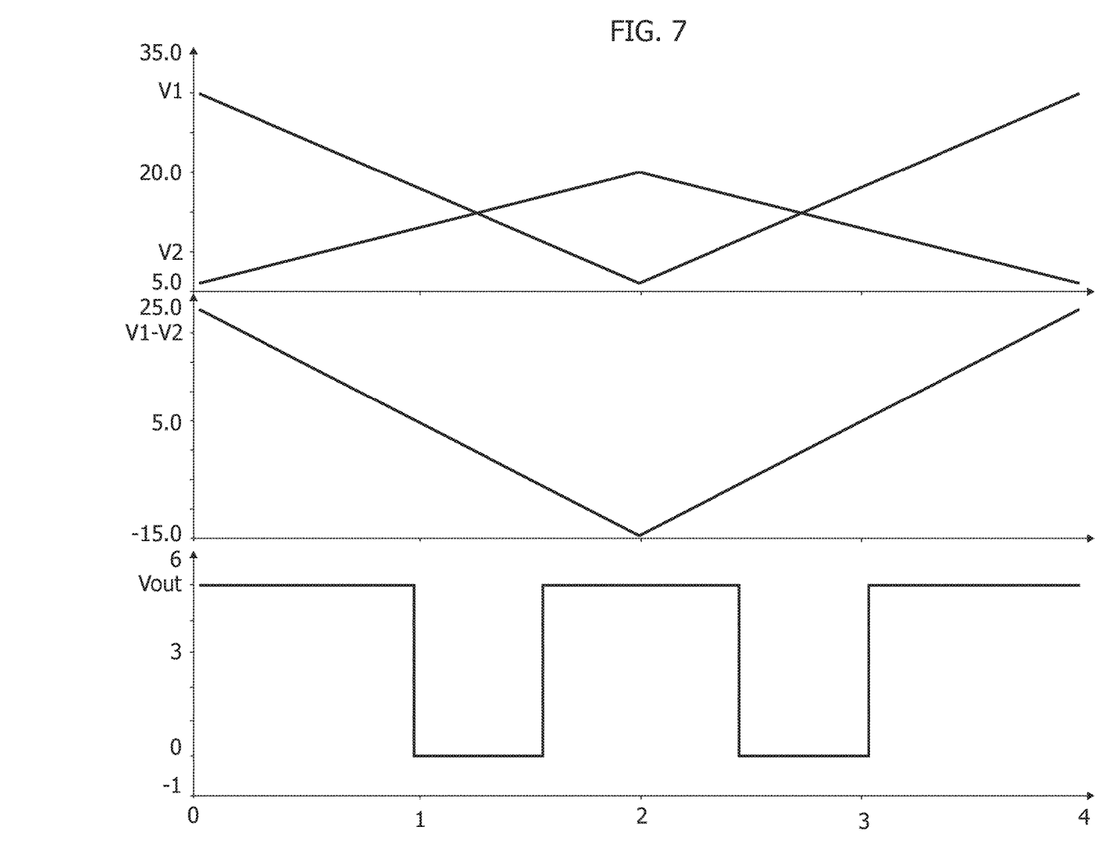
FIG. 7 is a graph showing input and output voltages of the second embodiment.

This operation can be clearly seen in FIG. 7. At time t=0, voltage V1 is 30V, voltage V2 is 6V, and V1-V2 is 24V. Vref in the electronic device 50 is 5 V (Vdd). Since 30>6+5, Vout transitions to a logic high (Vdd). Thus, if I1≥I2+Iref, Vout will equal Vdd. At time t=1.5, voltage V1 is ~14V, voltage V2 is 14V, and V1-V2=0 V. Since 14<14+5, Vout will be at ground. At time t=2, voltage V1 is 6V, voltage V2 is 20V, and V1-V2 is -14V. Since 20>6+5, Vout will be at Vdd. At time t=2.5, voltage V1 is ~14V, voltage V2 is 14V, and V1-V2=0V. Since 14<14+5, Vout will be at ground. At time t=3.5, voltage V1 is 25V, voltage V2 is 8V, and V1-V2 is 17V. Since 25>8+5, Vout will be at Vdd.

Figure 5:
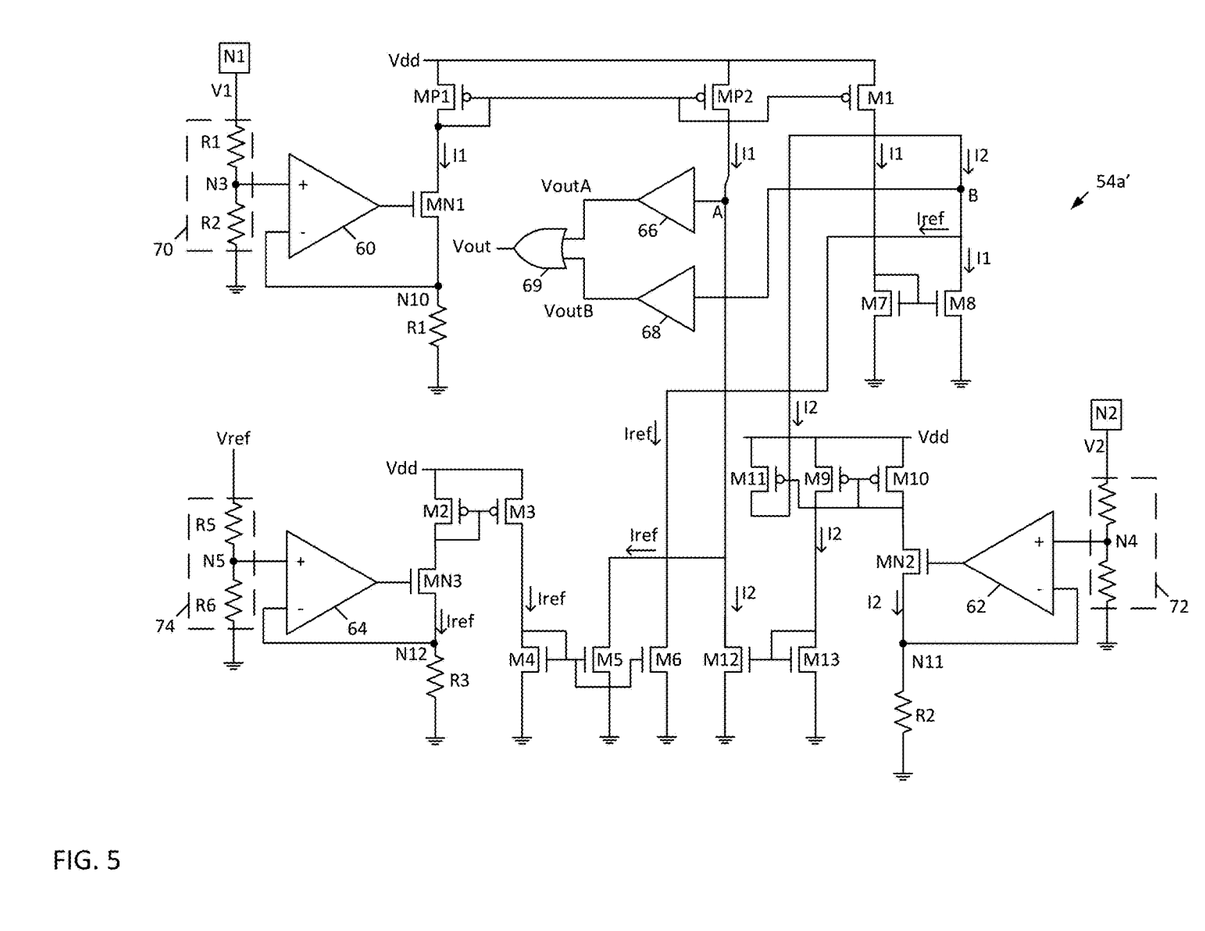
FIG. 5 is a schematic block diagram of a more detailed version of the second embodiment of the monitoring circuit of FIG. 1.

A more detailed version of the monitoring circuit 54a' is now described with additional reference to FIG. 5.

The monitoring circuit 54a' receives voltage V1 as a first input voltage at node N1. A voltage divider 70 is coupled between node N1 and ground. A first amplifier 60 has a non-inverting terminal coupled to the voltage divider 70 at center tap N3, and an inverting terminal coupled to node N10. A resistor R1 is coupled between node N10 and ground. An n-channel transistor MN1 has its gate coupled to be biased by the output of amplifier 60, it source coupled to node N10, and its drain coupled to a current mirror formed by p-channel transistors MP1-MP2. P-channel transistor M1 has its gate coupled to the gate of p-channel transistor MP1, its source coupled to Vdd, and its drain coupled to the current mirror formed by transistors M7-M8, the output of which is coupled to node B.

The monitoring circuit 54a' receives voltage V2 as a second input voltage at node N2. A voltage divider 72 is coupled between node N2 and ground. A second amplifier 62 has a non-inverting terminal coupled to the voltage divider 72 at center tap N4, and an inverting terminal coupled to node N11. A resistor R2 is coupled between node N11 and ground. An n-channel transistor MN2 has its gate coupled to be biased by the output of amplifier 62, it source coupled to node N11, and its drain coupled to a current mirror formed by p-channel transistors M9-M10. The output of the current mirror formed by p-channel transistors M9-M10 is coupled to the input of a current mirror formed by transistors M12-M13, the output of which is coupled to node A. P-channel transistor M11 has its gate coupled to the gate of P-channel transistor M9, its source coupled to Vdd, and its drain coupled to node B.

The monitoring circuit 54a' receives a reference voltage Vref, and a voltage divider 74 is coupled between the reference voltage Vref and ground. A third amplifier 64 has a non-inverting terminal coupled to the voltage divider 74 at center tap N5, and an inverting terminal coupled to node N12. A resistor R3 is coupled between node N12 and ground. An n-channel transistor MN3 has its gate coupled to be biased by the output of amplifier 64, it source coupled to node N12, and its drain coupled to an input of a current mirror formed by transistors M2-M3. The output of the current mirror formed by transistors M2-M3 is coupled to the input of a current mirror formed by transistors M4-M5, the output of which in turn is coupled to node A. N-channel transistor M6 has its gate coupled to the gate of transistor M5, its source coupled to ground, and its drain coupled to node B.

Buffer 66 has its input coupled to node A and provides an output signal VoutA. Buffer 68 has its input coupled to node B and provides an output signal VoutB. Output signal VoutA is coupled to OR gate 69, and output signal VoutB is coupled to OR gate 69. OR gate 69 generates signal Vout at its output.

Operation of the monitoring circuit 54a is now described. Amplifier 60 acts as a voltage to current converter and controls transistor MN1 to draw current I1, and current I1, is based on voltage V1. The current mirror formed from transistors MP1-MP2 mirrors current I1, to be sourced into node A. Amplifier 62 acts as a voltage to current converter and controls transistor MN2 to draw current I2, and current I2 is based on voltage V2. Current I2 is mirrored by transistors M9-M10 to transistors M12-M13, and then is sunk from node A. Amplifier 64 acts as a voltage to current converter and controls transistor MN3 to draw reference current Iref, and reference current Iref is based on reference voltage Vref. Reference current Iref is mirrored through transistors M2-M3, to transistors M4-M5, and is then sunk from node A.

P-channel transistor M1 mirrors current I1, to transistors M7-M8, which sink current I1, from node B. P-channel transistor M11 mirrors current I2 to be sourced to node B. Transistor M6 mirrors transistors M4-M5 to sink current Iref from node B.

As explained above, node A acts as a current summing junction. Therefore, if I1≥I2+Iref, the current flow into the input of buffer 66 will be positive, resulting in the voltage at node A increasing, and the output VoutA of buffer 66 going to Vref (which may be Vdd). If I1<I2+Iref, current will be drawn from, or not flow into, the input of buffer 66, resulting in the voltage at node A decreasing, and the output VoutA of buffer 66 falling to ground.

Node B also acts as a current summing junction. Since current I2 is sourced to node B, while currents I1, and Iref are sunk from node B, Therefore, if I2>I1+Iref, the current flow into the input of buffer 68 will be positive, resulting in the voltage at node B increasing, and output VoutB of buffer 68 going to Vref (which may be Vdd). If I2<I1+Iref, current will be drawn from, or not flow into, the input of buffer 68, resulting in the voltage at node B decreasing, and output VoutB of buffer 68 falling to ground. Outputs VoutA and VoutB are logically OR'd together by OR gate 69 to provide output signal Vout. Thus, Vout will be at Vref (which may be Vdd) if I1≥I2+Iref or if I2≥I1+Iref, and will be at ground if I1<I2+Iref or if I2<I1+Iref.

The above described monitoring circuits are programmable and settable. By changing the value of Vref, the current Iref can be changed. Thus, the offset used for the comparisons is programmable. This allows for the monitoring circuits to be usable with any power transistor after a simple adjustment of Vref to match the appropriate limit for a given power transistor.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   a power switch having a control terminal coupled to a first node, a first conduction terminal coupled to a second node, and a second conduction terminal coupled to a third node;
   a monitoring circuit having a first input coupled to the first node and a second input coupled to the second node, the monitoring circuit configured to generate a monitor signal indicating gate oxide stress on the power switch as a function of first and second voltages respectively received at the first and second inputs thereof;
   wherein the monitoring circuit comprises:
      a first voltage to current converter generating a first current as a function of a first input voltage;
      a second voltage to current converter generating a second current as a function of a second input voltage;
      a third voltage to current converter generating a reference current as a function of a reference voltage;
      a current summing node coupled to receive the first current, second current, and reference current such that the first current is sourced to the current summing node, the second current is sunk from the current summing node, and the reference current is sunk from the current summing node; and
      a buffer having an input coupled to the current summing node;
   a protection circuit configured to actuate to protect the power switch from the gate oxide stress when the monitor signal indicates the gate oxide stress on the power switch.

2. The electronic device of claim 1, wherein the reference voltage is programmable.

3. The electronic device of claim 1, wherein the first voltage to current converter comprises:
   a first amplifier having a non-inverting terminal coupled to a first voltage, an inverting terminal coupled to a first feedback node, and an output;
   a first transistor having a first conduction terminal coupled to a current mirror input, a second conduction terminal coupled the first feedback node, and a control terminal coupled to the output of the first amplifier;
   wherein the first current is drawn from the current mirror input;
   a first resistive divider coupled between the first input voltage and ground and producing the first voltage at a center tap thereof; and
   a first resistor coupled between the second conduction terminal of the first transistor and ground.

4. The electronic device of claim 3, further comprising a current mirror having the current mirror input, a current mirror output coupled to the current summing node, and being configured to mirror the first current to the current summing node.

5. The electronic device of claim 4, wherein the second voltage to current converter comprises:
   a second amplifier having a non-inverting terminal coupled to a second voltage, an inverting terminal coupled to a second feedback node, and an output;
   a second transistor having a first conduction terminal coupled to the current summing node, a second conduction terminal coupled the second feedback node, and a control terminal coupled to the output of the second amplifier;
   wherein the second current is drawn from the current summing node;
   a second resistive divider coupled between the second input voltage and ground and producing the second voltage at a center tap thereof; and
   a second resistor coupled between the second conduction terminal of the second transistor and ground.

6. The electronic device of claim 5, wherein the third voltage to current converter comprises:
   a third amplifier having a non-inverting terminal coupled to a third voltage, an inverting terminal coupled to a third feedback node, and an output;
   a third transistor having a first conduction terminal coupled to the current summing node, a second conduction terminal coupled the third feedback node, and a control terminal coupled to the output of the third amplifier;
   wherein the third current is drawn from the current summing node;
   a third resistive divider coupled between the reference voltage and ground and producing the third voltage at a center tap thereof; and
   a third resistor coupled between the second conduction terminal of the third transistor and ground.

7. The electronic device of claim 6, further comprising:
   a second current summing node;

a first current mirror configured to mirror the first current to the second current summing node;
a second current mirror configured to mirror the second current to the second current summing node;
a third current mirror configured to mirror the reference current to the second current summing node;
wherein the second current summing node receives the first current, second current, and reference current such that the second current is sourced to the second current summing node, the first current is sunk from the second current summing node, and the reference current is sunk from the second current summing node;
a second buffer having an input coupled to the second current summing node;
an OR gate coupled to receive as input outputs from the first and second buffers.

8. The electronic device of claim 7, wherein:
the buffer is configured to output the reference voltage where the first current is greater than a sum of the second current and the reference current;
the buffer is configured to output a ground voltage where the first current is less than the sum of the second current and the reference current;
the second buffer is configured to output the reference voltage where the second current is greater than a sum of the first current and the reference current; and
the second buffer is configured to output a ground voltage where the second current is less than the sum of the first current and the reference current.

9. An electronic device, comprising:
a first voltage to current converter generating a first current as a function of a first input voltage;
a second voltage to current converter generating a second current as a function of a second input voltage;
a third voltage to current converter generating a reference current as a function of a programmable voltage;
a current summing node coupled to receive the first current, second current, and reference current such that the first current is sourced to the current summing node, the second current is sunk from the current summing node, and the reference current is sunk from the current summing node;
a buffer having an input coupled to the current summing node;
wherein the buffer is configured to output the programmable voltage where the first current is greater than a sum of the second current and the reference current;
wherein the buffer is configured to output a ground voltage where the first current is less than the sum of the second current and the reference current.

10. The electronic device of claim 9, wherein the first voltage to current converter comprises:
a first amplifier having a non-inverting terminal coupled to a first voltage, an inverting terminal coupled to a first feedback node, and an output; and
a first transistor having a first conduction terminal coupled to a current mirror input, a second conduction terminal coupled the first feedback node, and a control terminal coupled to the output of the first amplifier;
wherein the first current is drawn from the current mirror input.

11. The electronic device of claim 10, wherein the first voltage to current converter further comprises:
a first resistive divider coupled between the first input voltage and ground and producing the first voltage at a center tap thereof; and
a first resistor coupled between the second conduction terminal of the first transistor and ground.

12. The electronic device of claim 11, further comprising a current mirror having the current mirror input, a current mirror output coupled to the current summing node, and being configured to mirror the first current to the current summing node.

13. The electronic device of claim 9, wherein the second voltage to current converter comprises:
a second amplifier having a non-inverting terminal coupled to a second voltage, an inverting terminal coupled to a second feedback node, and an output; and
a second transistor having a first conduction terminal coupled to the current summing node, a second conduction terminal coupled the second feedback node, and a control terminal coupled to the output of the second amplifier;
wherein the second current is drawn from the current summing node.

14. The electronic device of claim 13, wherein the second voltage to current converter further comprises:
a second resistive divider coupled between the second input voltage and ground and producing the second voltage at a center tap thereof; and
a second resistor coupled between the second conduction terminal of the second transistor and ground.

15. The electronic device of claim 9, wherein the third voltage to current converter comprises:
a third amplifier having a non-inverting terminal coupled to a third voltage, an inverting terminal coupled to a third feedback node, and an output; and
a third transistor having a first conduction terminal coupled to the current summing node, a second conduction terminal coupled the third feedback node, and a control terminal coupled to the output of the third amplifier;
wherein the third current is drawn from the current summing node.

16. The electronic device of claim 15, wherein the third voltage to current converter further comprises:
a third resistive divider coupled between the programmable voltage and ground and producing the third voltage at a center tap thereof; and
a third resistor coupled between the second conduction terminal of the third transistor and ground.

17. The electronic device of claim 9, further comprising:
a second current summing node;
a first current mirror configured to mirror the first current to the second current summing node;
a second current mirror configured to mirror the second current to the second current summing node;
a third current mirror configured to mirror the reference current to the second current summing node;
wherein the second current summing node receives the first current, second current, and reference current such that the second current is sourced to the second current summing node, the first current is sunk from the second current summing node, and the reference current is sunk from the second current summing node;
a second comparator having a first input coupled to the second current summing node, and a second input coupled to the programmable voltage;
wherein the second comparator is configured to output the programmable voltage where the second current is greater than a sum of the first current and the reference current;

wherein the second comparator is configured to output a ground voltage where the second current is less than the sum of the first current and the reference current;
an OR gate coupled to receive as input outputs from the buffer and the second comparator.

18. An electronic device, comprising:
a first voltage to current converter receiving a first input voltage and generating a first current;
a second voltage to current converter receiving a second input voltage and generating a second current;
a third voltage to current converter receiving a programmable voltage and generating a reference current;
a current summing node;
a first current mirror circuit configured to mirror the first current to the current summing node;
a second current mirror circuit configured to mirror the second current to the current summing node;
a third current mirror circuit configured to mirror the reference current to the current summing node;
a current summing node coupled to receive the first current, second current, and reference current such that the first current is sourced to the current summing node, the second current is sunk from the current summing node, and the reference current is sunk from the current summing node; and
a comparator having a first input coupled to the current summing node, and a second input coupled to the programmable voltage.

19. The electronic device of claim 18 wherein the second current mirror circuit comprises a first current mirror configured to mirror the second current to a second current mirror configured to, in turn, mirror the second current to the current summing node.

20. The electronic device of claim 19, wherein the third current mirror circuit comprises a third current mirror configured to mirror the reference current to a fourth current mirror configured to, in turn, mirror the reference current to the current summing node.

21. The electronic device of claim 20, wherein the first voltage to current converter comprises:
a first amplifier having a non-inverting terminal coupled to a first voltage, an inverting terminal coupled to a first feedback node, and an output;
a first transistor having a first conduction terminal coupled to the first current mirror circuit, a second conduction terminal coupled the first feedback node, and a control terminal coupled to the output of the first amplifier;
wherein the first current is drawn from the first current mirror circuit;
a first resistive divider coupled between the first input voltage and ground and producing the first voltage at a center tap thereof; and
a first resistor coupled between the second conduction terminal of the first transistor and ground.

22. The electronic device of claim 21, wherein the second voltage to current converter comprises:
a second amplifier having a non-inverting terminal coupled to a second voltage, an inverting terminal coupled to a second feedback node, and an output;
a second transistor having a first conduction terminal coupled to the current summing node, a second conduction terminal coupled the second feedback node, and a control terminal coupled to the output of the second amplifier;
wherein the second current is drawn from the current summing node;
a second resistive divider coupled between the second input voltage and ground and producing the second voltage at a center tap thereof; and
a second resistor coupled between the second conduction terminal of the second transistor and ground.

23. The electronic device of claim 22, wherein the third voltage to current converter comprises:
a third amplifier having a non-inverting terminal coupled to a third voltage, an inverting terminal coupled to a third feedback node, and an output;
a third transistor having a first conduction terminal coupled to the current summing node, a second conduction terminal coupled the third feedback node, and a control terminal coupled to the output of the third amplifier;
wherein the third current is drawn from the current summing node;
a third resistive divider coupled between the programmable voltage and ground and producing the third voltage at a center tap thereof; and
a third resistor coupled between the second conduction terminal of the third transistor and ground.

* * * * *

UNITED STATES PATENT AND TRADEMARK OFFICE
CERTIFICATE OF CORRECTION

PATENT NO. : 10,243,550 B2
APPLICATION NO. : 15/625261
DATED : March 26, 2019
INVENTOR(S) : Pavan Nallamothu Page 1 of 6

It is certified that error appears in the above-identified patent and that said Letters Patent is hereby corrected as shown below:

In the Specification

In Column 6, Line number 50, please replace [[MP1-MP2]] with -- MP11-MP12 --.

In the Claims

Please replace Column 9, Lines 45-67 thru Column 14 with the following:

-- 1. An electronic device, comprising:
    a power switch having a control terminal coupled to a first node, a first conduction terminal coupled to a second node, and a second conduction terminal coupled to a third node;
    a monitoring circuit having a first input coupled to the first node and a second input coupled to the second node, the monitoring circuit configured to generate a monitor signal indicating gate oxide stress on the power switch as a function of first and second voltages respectively received at the first and second inputs;
        wherein the monitoring circuit comprises:
            a first voltage to current converter generating a first current as a function of a first input voltage;
            a second voltage to current converter generating a second current as a function of a second input voltage;
            a third voltage to current converter generating a reference current as a function of a reference voltage;
            a current summing node coupled to receive the first current, second current, and reference current such that the first current is sourced to the current summing node, the second current is sunk from the current summing node, and the reference current is sunk from the current summing node; and
            a first buffer having an input coupled to the current summing node; and
    a protection circuit configured to actuate to protect the power switch from the gate oxide stress when the monitor signal indicates the gate oxide stress on the power switch.

Signed and Sealed this
Seventh Day of January, 2020

Andrei Iancu
*Director of the United States Patent and Trademark Office*

2. The electronic device of claim 1, wherein the reference voltage is programmable.

3. The electronic device of claim 1, wherein the first voltage to current converter comprises:
    a first amplifier having a non-inverting terminal coupled to a first voltage, an inverting terminal coupled to a first feedback node, and an output;
    a first transistor having a first conduction terminal coupled to a current mirror input, a second conduction terminal coupled to the first feedback node, and a control terminal coupled to the output of the first amplifier;
    wherein the first current is drawn from the current mirror input;
    a first resistive divider coupled between the first input voltage and ground and producing the first voltage at a center tap thereof; and
    a first resistor coupled between the second conduction terminal of the first transistor and ground.

4. The electronic device of claim 3, further comprising a current mirror having the current mirror input, a current mirror output coupled to the current summing node, and being configured to mirror the first current to the current summing node.

5. The electronic device of claim 4, wherein the second voltage to current converter comprises:
    a second amplifier having a non-inverting terminal coupled to a second voltage, an inverting terminal coupled to a second feedback node, and an output;
    a second transistor having a first conduction terminal coupled to the current summing node, a second conduction terminal coupled to the second feedback node, and a control terminal coupled to the output of the second amplifier;
    wherein the second current is drawn from the current summing node;
    a second resistive divider coupled between the second input voltage and ground and producing the second voltage at a center tap thereof; and
    a second resistor coupled between the second conduction terminal of the second transistor and ground.

6. The electronic device of claim 5, wherein the third voltage to current converter comprises:
    a third amplifier having a non-inverting terminal coupled to a third voltage, an inverting terminal coupled to a third feedback node, and an output;
    a third transistor having a first conduction terminal coupled to the current summing node, a second conduction terminal coupled to the third feedback node, and a control terminal coupled to the output of the third amplifier;
    wherein the reference current is drawn from the current summing node;
    a third resistive divider coupled between the reference voltage and ground and producing the third voltage at a center tap thereof; and
    a third resistor coupled between the second conduction terminal of the third transistor and ground.

7. The electronic device of claim 6, further comprising:
   a second current summing node;
   a first current mirror configured to mirror the first current to the second current summing node;
   a second current mirror configured to mirror the second current to the second current summing node;
   a third current mirror configured to mirror the reference current to the second current summing node;
   wherein the second current summing node receives the first current, second current, and reference current such that the second current is sourced to the second current summing node, the first current is sunk from the second current summing node, and the reference current is sunk from the second current summing node;
   a second buffer having an input coupled to the second current summing node;
   an OR gate coupled to receive as input outputs from the first buffer and the second buffer and configured to output the monitor signal.

8. The electronic device of claim 7, wherein:
   the first buffer is configured to output the reference voltage where the first current is greater than a sum of the second current and the reference current;
   the first buffer is configured to output a ground voltage where the first current is less than the sum of the second current and the reference current;
   the second buffer is configured to output the reference voltage where the second current is greater than a sum of the first current and the reference current; and
   the second buffer is configured to output a ground voltage where the second current is less than the sum of the first current and the reference current.

9. An electronic device, comprising:
   a first voltage to current converter generating a first current as a function of a first input voltage;
   a second voltage to current converter generating a second current as a function of a second input voltage;
   a third voltage to current converter generating a reference current as a function of a programmable voltage;
   a current summing node coupled to receive the first current, second current, and reference current such that the first current is sourced to the current summing node, the second current is sunk from the current summing node, and the reference current is sunk from the current summing node; and
   a first buffer having an input coupled to the current summing node;
   wherein the first buffer is configured to output the programmable voltage if the first current is greater than a sum of the second current and the reference current; and
   wherein the first buffer is configured to output a ground voltage if the first current is less than the sum of the second current and the reference current.

10. The electronic device of claim 9, wherein the first voltage to current converter
comprises:
   a first amplifier having a non-inverting terminal coupled to a first voltage, an inverting terminal coupled to a first feedback node, and an output; and
   a first transistor having a first conduction terminal coupled to a current mirror input, a second conduction terminal coupled to the first feedback node, and a control terminal coupled to the output of the first amplifier;
   wherein the first current is drawn from the current mirror input.

11. The electronic device of claim 10, wherein the first voltage to current converter
further comprises:
   a first resistive divider coupled between the first input voltage and ground and producing the first voltage at a center tap thereof; and
   a first resistor coupled between the second conduction terminal of the first transistor and ground.

12. The electronic device of claim 11, further comprising a current mirror having the current mirror input, a current mirror output coupled to the current summing node, and being configured to mirror the first current to the current summing node.

13. The electronic device of claim 9, wherein the second voltage to current converter
comprises:
   a second amplifier having a non-inverting terminal coupled to a second voltage, an inverting terminal coupled to a second feedback node, and an output; and
   a second transistor having a first conduction terminal coupled to the current summing node, a second conduction terminal coupled to the second feedback node, and a control terminal coupled to the output of the second amplifier;
   wherein the second current is drawn from the current summing node.

14. The electronic device of claim 13, wherein the second voltage to current converter
further comprises:
   a second resistive divider coupled between the second input voltage and ground and producing the second voltage at a center tap thereof; and
   a second resistor coupled between the second conduction terminal of the second transistor and ground.

15. The electronic device of claim 9, wherein the third voltage to current converter
comprises:
   a third amplifier having a non-inverting terminal coupled to a third voltage, an inverting terminal coupled to a third feedback node, and an output; and
   a third transistor having a first conduction terminal coupled to the current summing node, a second conduction terminal coupled to the third feedback node, and a control terminal coupled to the output of the third amplifier;
   wherein the reference current is drawn from the current summing node.

16. The electronic device of claim 15, wherein the third voltage to current converter further comprises:
    a third resistive divider coupled between the programmable voltage and ground and producing the third voltage at a center tap thereof; and
    a third resistor coupled between the second conduction terminal of the third transistor and ground.

17. The electronic device of claim 9, further comprising:
    a second current summing node;
    a first current mirror configured to mirror the first current to the second current summing node;
    a second current mirror configured to mirror the second current to the second current summing node;
    a third current mirror configured to mirror the reference current to the second current summing node;
    wherein the second current summing node receives the first current, second current, and reference current such that the second current is sourced to the second current summing node, the first current is sunk from the second current summing node, and the reference current is sunk from the second current summing node;
    a second buffer having an input coupled to the second current summing node;
    wherein the second buffer is configured to output the programmable voltage if the second current is greater than a sum of the first current and the reference current;
    wherein the second buffer is configured to output a ground voltage if the second current is less than the sum of the first current and the reference current; and
    an OR gate coupled to receive as input outputs from the first buffer and the second buffer.

18. An electronic device, comprising:
    a first voltage to current converter receiving a first input voltage and generating a first current;
    a second voltage to current converter receiving a second input voltage and generating a second current;
    a third voltage to current converter receiving a programmable voltage and generating a reference current;
    a current summing node;
    a first current mirror circuit configured to mirror the first current to the current summing node;
    a second current mirror circuit configured to mirror the second current to the current summing node;
    a third current mirror circuit configured to mirror the reference current to the current summing node;
    wherein the current summing node is coupled to receive the first current, second current, and reference current such that the first current is sourced to the current summing node, the second current is sunk from the current summing node, and the reference current is sunk from the current summing node; and
    a buffer having an input coupled to the current summing node.

19. The electronic device of claim 18 wherein the second current mirror circuit comprises a first current mirror configured to mirror the second current to a second current mirror configured to mirror the second current to the current summing node.

20. The electronic device of claim 19, wherein the third current mirror circuit comprises a third current mirror configured to mirror the reference current to a fourth current mirror configured to mirror the reference current to the current summing node.

21. The electronic device of claim 20, wherein the first voltage to current converter comprises:
   a first amplifier having a non-inverting terminal coupled to a first voltage, an inverting terminal coupled to a first feedback node, and an output;
   a first transistor having a first conduction terminal coupled to the first current mirror circuit, a second conduction terminal coupled to the first feedback node, and a control terminal coupled to the output of the first amplifier;
   wherein the first current is drawn from the first current mirror circuit;
   a first resistive divider coupled between the first input voltage and ground and producing the first voltage at a center tap thereof; and
   a first resistor coupled between the second conduction terminal of the first transistor and ground.

22. The electronic device of claim 21, wherein the second voltage to current converter comprises:
   a second amplifier having a non-inverting terminal coupled to a second voltage, an inverting terminal coupled to a second feedback node, and an output;
   a second transistor having a first conduction terminal coupled to the current summing node, a second conduction terminal coupled to the second feedback node, and a control terminal coupled to the output of the second amplifier;
   wherein the second current is drawn from the current summing node;
   a second resistive divider coupled between the second input voltage and ground and producing the second voltage at a center tap thereof; and
   a second resistor coupled between the second conduction terminal of the second transistor and ground.

23. The electronic device of claim 22, wherein the third voltage to current converter comprises:
   a third amplifier having a non-inverting terminal coupled to a third voltage, an inverting terminal coupled to a third feedback node, and an output;
   a third transistor having a first conduction terminal coupled to the current summing node, a second conduction terminal coupled to the third feedback node, and a control terminal coupled to the output of the third amplifier;
   wherein the reference current is drawn from the current summing node;
   a third resistive divider coupled between the programmable voltage and ground and producing the third voltage at a center tap thereof; and
   a third resistor coupled between the second conduction terminal of the third transistor and ground. --